United States Patent [19]

Hamada et al.

[11] Patent Number: 5,597,669
[45] Date of Patent: Jan. 28, 1997

[54] FRAME-SUPPORTED PELLICLE FOR PHOTOLITHOGRAPHY

[75] Inventors: Yuichi Hamada; Meguru Kashida; Yoshihiro Kubota, all of Annaka, Japan

[73] Assignee: Shin-Etsu Chemical Co., Ltd., Tokyo, Japan

[21] Appl. No.: 524,546

[22] Filed: Sep. 7, 1995

[30] Foreign Application Priority Data

Sep. 30, 1994 [JP] Japan .................................. 6-236240

[51] Int. Cl.⁶ ...................................................... G03F 9/00
[52] U.S. Cl. ................... 430/5; 428/14; 428/421; 428/422
[58] Field of Search .......................... 430/5, 6, 9; 428/14, 428/421, 422

[56] References Cited

U.S. PATENT DOCUMENTS 5,370,951  1/1993  Kubota et al. ................................ 430/5
5,378,514  8/1993  Hamada et al. ........................... 428/14

*Primary Examiner*—S. Rosasco
*Attorney, Agent, or Firm*—David E. Dougherty

[57] ABSTRACT

Proposed is a frame-supported pellicle for dustproof protection of a photomask in the photolithographic patterning work for the manufacture of fine electronic devices having excellent mechanical properties and durability of the pellicle membrane against air blow and ultraviolet irradiation. The advantages of the inventive frame-supported pellicle is obtained by the use of, in place of conventional cellulose-based polymers and fluorocarbon-based resins, a norbornene-based plastic resin as the material of the pellicle membrane spread over and adhesively bonded to one end surface of a rigid frame in a slack-free fashion.

2 Claims, No Drawings

FRAME-SUPPORTED PELLICLE FOR PHOTOLITHOGRAPHY

BACKGROUND OF THE INVENTION

The present invention relates to a frame-supported pellicle for photolithography or, more particularly, to a frame-supported pellicle which is a device consisting of a rigid frame and a thin transparent film of a plastic resin spread over and adhesively bonded to one end surface of the frame in a slack-free fashion and used for dustproof protection of a photomask in the photolithographic patterning works involved in the manufacturing process of fine electronic devices such as ICs, LSIs and the like.

As is known, the manufacturing process of fine electronic devices such as ICs and LSIs as well as liquid-crystal display panels and the like involves a photolithographic patterning work in which a patterned resist layer is formed on the surface of a substrate such as a semiconductor silicon wafer by pattern-wise exposure to light of a uniform photoresist layer through a pattern-bearing transparency called a photomask followed by the development of the patterned latent image. In view of the extreme fineness of the pattern to be reproduced, any smallest number of dust particles deposited on the photomask may cause a heavy decrease in the quality of the reproduced pattern consequently to affect the quality of the electronic devices manufactured thereby.

Although the patterning work above mentioned is performed usually in a clean room of which the atmospheric air is freed from floating dust particles as completely as possible, it is a difficult matter to ensure a perfectly dust-free condition of the photomasks even in a clean room of the highest class. Accordingly, it is a usual practice that the photomask is protected from falling dust particles by mounting thereon a frame-supported pellicle or, simply, pellicle, which is an integral device consisting of a frame, referred to as a pellicle frame hereinafter, of a rigid material such as an aluminum-based alloy, stainless steel, high-density polyethylene and the like and a thin, highly transparent membrane, referred to as a pellicle membrane hereinafter, spread over and adhesively bonded to one end surface of the pellicle frame in a slack-free fashion while the other end surface of the pellicle frame is coated with a pressure-sensitive adhesive so as to facilitate securing of the pellicle frame on the proper position of the photomask when the pellicle is mounted on the photomask.

Since dust particles fall and are deposited on the pellicle membrane which is apart from the photomask by the height of the pellicle frame when the frame-supported pellicle is mounted on the photomask, the dust particles on the pellicle membrane have no particular adverse influences against the rays of light focused at the photomask to minimize degradation of the quality of the reproduced pattern.

While the above mentioned pellicle membranes are conventionally made from various plastic resins such as nitrocellulose, cellulose acetate and the like having high transparency, several other plastic resins have come under practical use for the purpose in order to comply with the requirements for the pellicle membranes being upgraded year by year. For example, it is a recent trend in the photolithographic patterning work that the wavelength of the light used for the pattern-wise light-exposure is shorter and shorter than heretofore to give higher resolution of pattern reproduction required for the manufacture of electronic devices of increased fineness so that a proposal has been made for the use of an-amorphous fluorocarbon-based special plastic resin as the material of the pellicle membranes in view of their high resistance to withstand the short-wavelength ultraviolet light which necessarily causes serious photodegradation of other conventional plastic resins for pellicle membranes. Even by setting aside the problem of their expensiveness, these fluorocarbon-based plastic resins as a material of pellicle membranes have a defect that, as compared with membranes of conventional nitrocellulose, cellulose acetate and the like, the membrane thereof is subject to stretching under an external force so that the slack-free condition of the pellicle membrane on the pellicle frame is sometimes lost by air blowing conventionally undertaken in order to blow off dust particles deposited thereon.

SUMMARY OF THE INVENTION

The present invention accordingly has an object to provide a novel and improved frame-supported pellicle for dustproof protection of a photomask in the photolithographic patterning work to be freed from the above described problems and disadvantages in the conventional flame-supported pellicles of the prior art.

Thus, the flame-supported pellicle for photolithography provided by the present invention is an integral device which comprises:

(a) a frame made from a rigid material; and
(b) a membrane spread over and adhesively bonded to one end surface of the frame in a slack-free fashion, said membrane being formed from a plastic resin which is a homopolymer of a norbornene compound or a copolymer of a monomer mixture mainly consisting of a norbornene compound having a degree of hydrogenation of at least 99.0%.

DETAILED DESCRIPTION OF THE PREFERRED EMBODIMENTS

As is described above, the most characteristic feature of the inventive frame-supported pellicle consists in the use of a very specific plastic resin as the material of the pellicle membrane, which is a homopolymer of a norbornene compound or a copolymer of a monomer mixture mainly consisting of a norbornene compound having a degree of hydrogenation of at least 99.0%. Besides the inexpensiveness as compared with the above mentioned fluorocarbon-based special plastic resins, the membrane of a norbornene-based plastic resin used in the inventive frame-supported pellicle is quite unexpectedly highly resistant against slackening under air blow as compared with the pellicle membranes of a cellulose-based plastic resins such as nitrocellulose and cellulose acetate and, when the degree of hydrogenation thereof is 99.0% or larger, the membrane is imparted with a great increase in the transmissivity to light and resistance against irradiation with ultraviolet light to ensure excellent durability.

The plastic resin as the material of the pellicle membrane in the inventive frame-supported pellicle is a homopolymer or copolymer of a norbornene compound. Norbornene per se is a compound having a chemical name of bicyclo[2,2,1]-2-heptene and has a molecular formula of $C_7H_{10}$. The compound can be prepared by the addition reaction of ethylene to cyclopentadiene or dechlorination reaction of 2,5-dichloronorbornene. Since norbornene has a reactive double bond in a molecule, various derivatives can be prepared therefrom by hydrogenation, hydrobromination, addition of thiocresol and so on. Various kinds of plastic resins are available on the market as a homopolymer or copolymer of these norbornene derivatives including those sold under the tradenames of ZEONEX products (each a product by Nippon Zeon Co.) which can be used satisfactorily as the material of the pellicle membrane in the inventive frame-supported pellicle.

The membrane as the pellicle membrane in the inventive frame-supported pellicle can be prepared by the so-called casting method in which the plastic resin is dissolved in a suitable organic solvent such as xylene to give a solution which is spread over the well-polished surface of, e.g., a fused silica glass plate held horizontally followed by evaporation of the solvent to leave a film of the plastic resin on the surface. The thus formed film of the plastic resin is, before or after separation from the plate surface, adhesively bonded to one end surface of a pellicle frame separately prepared to serve as the pellicle membrane.

In the following, the frame-supported pellicle of the present invention is illustrated in more detail by way of examples and comparative examples.

EXAMPLE 1

A plastic resin which was a norbornene-based polymer having a degree of hydrogenation of at least 99.0% (ZEONEX TD 001, a product by Nippon Zeon Co.) was dissolved in xylene to prepare a solution in a concentration of 8% by weight. The solution was spread over a well-polished surface of a fused silica glass disk of 200 mm diameter and 3 mm thickness on a spin coater followed by evaporation of the solvent at 150° C. for 15 minutes to give a film of the resin having a thickness of 1.5 μm as dried.

Separately, a surface-anodized square aluminum frame having an outer side length of 120 mm, thickness of the frame of 2.0 mm and height of the frame of 5.8 mm was coated on one end surface thereof with an epoxy-based adhesive (Araldite XNR 3506, a product by Nippon Ciba-Geigy Co.) and the above prepared membrane was attached and bonded to the adhesive-coated end surface of the frame followed by heating at 80° C. for 1 hour to obtain a frame-supported pellicle by effecting curing of the adhesive.

The thus obtained frame-supported pellicle was subjected to the air-blow test in the following manner to determine the resistance against pressurization. Thus, a nozzle of an air gun having a diameter of 1 mm was held perpendicularly directing to the center of the pellicle membrane keeping a distance of 10 mm between the nozzle end and the membrane and air of 50% relative humidity at 25° C. was blown from the nozzle at the membrane for 10 seconds in each of the stepwise increased air gun pressures starting from 2.0 kgf/cm$^2$ with increments of each 0.5 kgf/cm$^2$ to record the lowest air gun pressure by which the pellicle membrane was broken. The result was that the pellicle membrane could withstand the air blow up to the air gun pressure of 3.0 kgf/cm$^2$ but became broken at a pressure of 3.5 kgf/cm$^2$.

Further, a photodegradation test was undertaken for the pellicle membrane by irradiating the membrane with ultraviolet light of 365 nm wavelength in an intensity of 20 mW/cm$^2$ to find that the membrane was stable and safe after 700 hours of the ultraviolet irradiation.

EXAMPLE 2

The experimental procedure was substantially the same as in Example 1 described above except that the plastic resin ZEONEX TD 001 was replaced with another grade of the norbornene-based plastic resin having a degree of hydrogenation lower than 99.0% (ZEONEX 250, a product by the same company supra).

The result of the air blow test was that the pellicle membrane could withstand the air blow up to the air gun pressure of 3.0 kgf/cm$^2$ but became broken at a pressure of 3.5 kgf/cm$^2$. The result of the photodegradation test was that the pellicle membrane was stable and safe up to 300 hours of the ultraviolet irradiation while very slight discoloration was noted by the irradiation for 500 hours and the membrane was broken by the irradiation for 700 hours.

Comparative Example 1

The experimental procedure was substantially the same as in Example 1 described above except that the plastic resin ZEONEX TD 001 was replaced with an amorphous fluorocarbon-based resin which was a copolymer of tetrafluoroethylene and a cyclic perfluoro ether (Cytop CTXS, a product by Asahi Glass Co.), which was dissolved in the solvent therefor recommended by the manufacturer (CT Solv 180, a product by the same company, supra) to give a solution of 6% by weight concentration from which a film of 1.6 μm thickness was prepared by the casting method.

The result of the air blow test was that the pellicle membrane could withstand the air blow at the air gun pressure of 2.0 kgf/cm$^2$ but slackening of the pellicle membrane was noted at an air gun pressure of 2.5 kgf/cm$^2$ and the pellicle membrane became broken at a pressure of 3.0 kgf/cm$^2$.

Comparative Example 2

The experimental procedure was substantially the same as in Example 1 described above except that the plastic resin ZEONEX TD 001 was replaced with cellulose propionate from which a film of 1.4 μm thickness was prepared by the casting method.

The result of the air blow test was that the pellicle membrane could withstand the air blow up to the air gun pressure of 2.5 kgf/cm$^2$ but became broken at a pressure of 3.0 kgf/cm$^2$.

What is claimed is:

1. A frame-supported pellicle for photolithography as an integral device which comprises:
   (a) a frame made from a rigid material; and
   (b) a membrane spread over and adhesively bonded to one end surface of the frame in a slack-free fashion, said membrane being formed from a plastic resin which is a homopolymer of a norbornene compound or a copolymer of a monomer mixture mainly consisting of a norbornene compound.

2. The frame-supported pellicle for photolithography as claimed in claim 1 in which the degree of hydrogenation of the homopolymer of a norbornene compound or the copolymer of a monomer mixture mainly consisting of a norbornene compound is at least 99.0%.

* * * * *